(12) United States Patent
Beer

(10) Patent No.: US 7,009,869 B2
(45) Date of Patent: Mar. 7, 2006

(54) DYNAMIC MEMORY CELL

(75) Inventor: Peter Beer, Fontainbleau (FR)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 10/723,289

(22) Filed: Nov. 25, 2003

(65) Prior Publication Data

US 2004/0151020 A1 Aug. 5, 2004

(30) Foreign Application Priority Data

Nov. 27, 2002 (DE) .............................. 102 55 203

(51) Int. Cl.
*G11C 11/24* (2006.01)

(52) U.S. Cl. ........................................ 365/149; 365/63

(58) Field of Classification Search ................ 365/149, 365/63, 214; 257/301
See application file for complete search history.

(56) References Cited

U.S. PATENT DOCUMENTS

| 5,363,327 A | * | 11/1994 | Henkles et al. ............. 365/149 |
| 5,571,743 A | * | 11/1996 | Henkels et al. ............. 438/241 |
| 5,780,335 A |   | 7/1998  | Henkels et al. ............. 438/243 |
| 6,034,879 A | * | 3/2000  | Min et al. ...................... 365/63 |
| 6,339,241 B1 |  | 1/2002  | Mandelman et al. ........ 257/301 |
| 6,570,794 B1 | * | 5/2003 | Hokenmaier et al. ........ 365/200 |

OTHER PUBLICATIONS

German Examination Report Dated May 27, 2003.

* cited by examiner

*Primary Examiner*—Anh Phung
(74) *Attorney, Agent, or Firm*—Patterson & Sheridan, L.L.P.

(57) ABSTRACT

A dynamic memory cell which can be selected by means of a selection signal and the content of which can be read out by means of a bit line pair with a first and a second bit line, having a storage capacitor and a first and a second selection transistor, in which case, depending on the selection signal, a first terminal of the storage capacitor can be connected to the first bit line via the first selection transistor and a second terminal of the storage capacitor can be connected to the second bit line via the second selection transistor, is provided.

20 Claims, 2 Drawing Sheets

DYNAMIC MEMORY CELL

CROSS-REFERENCE TO RELATED APPLICATIONS

This application claims foreign priority benefits under 35 U.S.C. §119 to co-pending German patent application 102 55 203.7-53, filed Nov. 27, 2002. This related patent application is herein incorporated by reference.

BACKGROUND OF THE INVENTION

1. Field of the Invention

The invention relates to a dynamic memory cell for use in a DRAM memory.

2. Description of the Related Art

DRAM memory cells known hitherto have the disadvantage that only the potential of one bit line of a bit line pair is altered during an activation in the time in which the cell charge flows onto the bit line. The potential difference on the bit lines of the bit line pair is amplified by a sense amplifier, in which the potential with the higher charge is increased and the potential with the lower charge is decreased. The divergent separation of the charges on the bit lines of the bit line pair is not completely symmetrical since, proceeding from a center potential, only one of the bit lines is connected to the storage capacitor, so that initially only the charge of one bit line changes during the read-out of the memory cell. This leads to an asymmetrical divergent separation of the charges during amplification (presensing).

This behavior during presensing has the effect that it is not possible to completely preclude the signal coupling between adjacent bit lines of different adjacent bit line pairs with a twisting of the bit lines of the bit line pairs. By contrast the negative influences from the coupling between the bit lines can be virtually precluded with the aid of the twisting of the bit lines in the case of a symmetrical behavior in the case of charge separation in presensing.

SUMMARY OF THE INVENTION

It is an object of the present invention to provide a DRAM memory cell which makes it possible to reduce the negative coupling between the bit lines.

A first aspect of the present invention provides a dynamic memory cell which can be selected by means of a selection signal and the content of which can be read out by means of a bit line pair with a first and a second bit line. The dynamic memory cell has a storage capacitor connected to a first and a second selection transistor. Depending on the selection signal, the first terminal of the storage capacitor is connected to the first bit line via the first selection transistor and a second terminal of the storage capacitor is connected to the second bit line via the second selection transistor.

In this way, it is possible to provide a dynamic memory cell in which the charge content of the storage capacitor is applied to both bit lines of a bit line pair during the read-out. Prior to the read-out, the bit lines of the bit line pair are at an identical center potential brought about by a charge equalization carried out previously. As a result, in the event of simultaneous interposition of the capacitor between the bit lines of the bit line pair, the charge of one of the bit lines is reduced and the charge of the other bit line is increased by the same amount.

In this way, during the read-out of a memory cell, a signal profile which is essentially exactly the opposite, i.e. symmetrical, is achieved on the two bit lines. Thus, a bit line of a bit line pair which is essentially twisted in the center causes the opposite symmetrical signal profiles to be coupled in onto an untwisted adjacent bit line, so that the coupled-in signals reciprocally compensate one another.

It may be provided that the memory cell is constructed in a manner integrated in a substrate. The storage capacitor comprises a trench capacitor, an inner region being isolated from an outer region of the storage capacitor by an insulation layer in order to form a capacitor. The first selection transistor is connected to the inner region of the storage capacitor and the second selection transistor is connected to the outer region of the storage capacitor, so that, in the event of the selection transistors being activated, the charge of the inner region is applied to the first bit line and the charge of the outer region is applied to the second bit line.

Preferably, for this purpose, the first and second selection transistors are arranged vertically on both sides of the trench capacitor. By virtue of the vertical arrangement of the selection transistors, the area requirement for the realization of such a memory cell remains very small, so that a DRAM memory having such dynamic memory cells is not significantly enlarged compared with a conventional DRAM memory.

In order to realize the vertically arranged selection transistors, a drive region, to which the drive signal is applied, may be arranged above the trench capacitor. The drive region is preferably configured in such a way that it may simultaneously serve as a gate region for the first and the second selection transistors.

The drain/source regions of the selection transistors are arranged at the trench capacitor in such a way that the trench capacitor is contact-connected. In this case, the drain/source region of the first selection transistor makes contact with the outer region of the storage capacitor and the drain/source region of the second selection transistor makes contact with the inner region of the storage capacitor. The respective further drain/source regions of the selection transistors are arranged near the surface in order to contact-connect them to the corresponding bit lines onto which the stored charge is to be read out.

BRIEF DESCRIPTION OF THE DRAWINGS

Preferred embodiments of the invention are explained in more detail below with reference to the accompanying drawings, in which.

DETAILED DESCRIPTION OF THE PREFERRED EMBODIMENT

Figure 1:
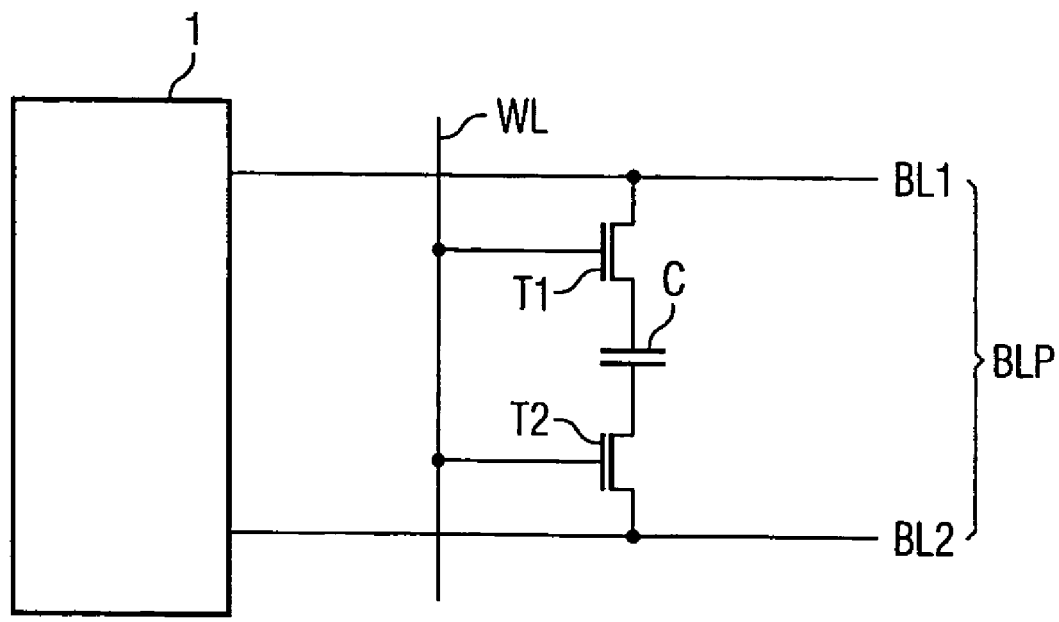
FIG. 1 shows an electrical diagram with components of a dynamic memory cell in accordance with a preferred embodiment of the invention.

FIG. 1 illustrates a dynamic memory cell according to the invention. The memory cell has a storage capacitor C, the first terminal of which is connected to a first bit line BL1 of a bit line BLP via a first selection transistor T1. A second terminal of the storage capacitor C is connected to a second bit line BL2 of the bit line pair BLP via a second selection transistor T2. Control terminals of the first selection transistor T1 and of the second selection transistor T2 can be driven via a word line WL. The selection transistors T1, T2 are preferably designed as n-channel field-effect transistors, so that the selection transistors T1, T2 are turned on in the event of a HIGH potential on the word line WL.

If the selection transistors are in the on state, then the charge stored in the storage capacitor C flows equally onto the first bit line BL1 and the second bit line BL2. The two bit lines BL1, BL2 of the bit line pair BLP have previously been equalized to a center potential by means of a charge equalizing device (not shown).

The first bit line BL1 and the second bit line BL2 of the bit line pair BLP are connected to a sense amplifier 1 at one end. The sense amplifier is configured in such a way that it detects a charge difference between the two bit lines BL1, BL2 of the bit line pair BLP and increases the potential of the bit line with the higher charge and decreases the potential of the bit line with the lower charge. By virtue of the fact that the charge stored in the storage capacitor is applied to both bit lines equally and simultaneously, the result is a symmetrical opposite signal profile around the center potential on the two bit lines.

Furthermore, such a memory cell has the advantage that the two bit lines BL1, BL2 of a bit line pair BLP then have the same capacitance upon connection to the memory cell. Asymmetries resulting from the fact that the storage capacitor is applied only into one of the bit lines can thus be avoided.

Moreover, the magnitude of the signal between the bit lines BL1, BL2 of the bit line pair BLP is doubled. This could be utilized either to improve the signal properties and thus make the chip more reliable or else to reduce the power consumption by, e.g., halving the center potential. This results in a further advantage, namely that the leakage current, which often depends on the applied voltage in non-ohmic fashion, i.e., nonlinear fashion, can be reduced more than proportionally by reducing the cell voltage.

Figure 2:
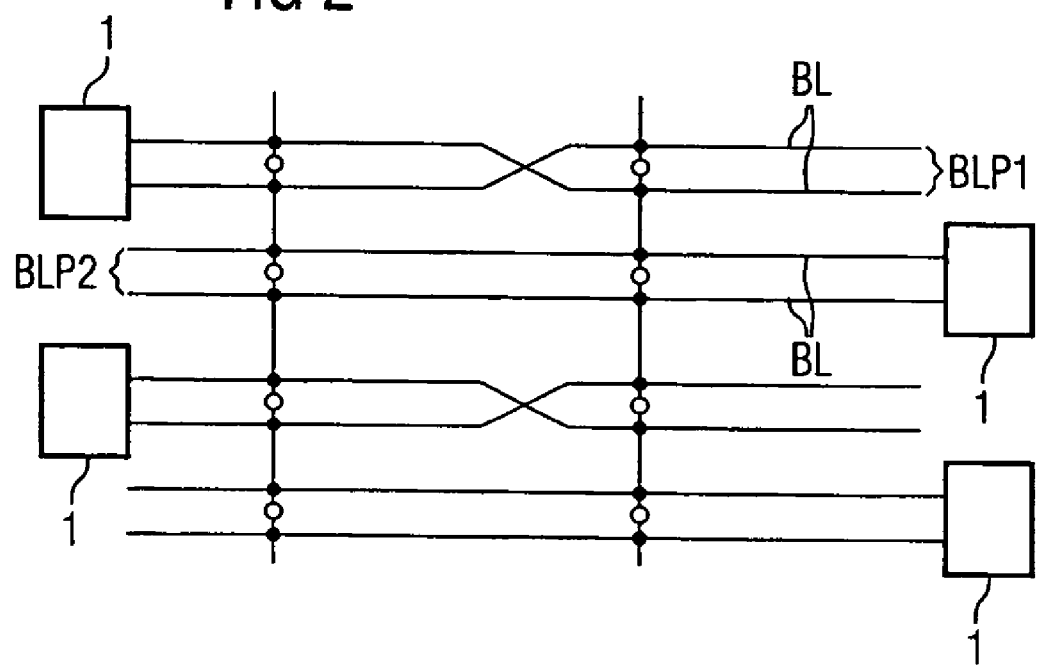
FIG. 2 shows a detail from a DRAM memory with memory cells in accordance with an embodiment of the invention with twisted bit lines.

FIG. 2 illustrates a detail from a DRAM memory with dynamic memory cells in accordance with the preferred embodiment of the invention. The selection transistors shown in FIG. 1 are represented symbolically in FIG. 2 in a simplified manner by means of points at the lines of intersection between the word lines WL and bit lines BL, and the storage capacitor C is represented symbolically by means of a point on the word line. It can be seen that the bit lines are twisted in the center in the case of every second bit line pair BLP.

A first bit line pair BLP1 has twisted bit lines and a second bit line pair BLP2 has non-twisted bit lines. The advantage of such an arrangement is that a half of the first bit line of the first bit line pair BLP1 is routed adjacent to the first bit line of the second bit line pair BLP2. Equally, a half of the second bit line BL2 of the first bit line pair BLP1 is routed adjacent to the first bit line of the second bit line pair BLP2. Since instances of signal overcoupling occur between adjacent bit lines, in this way the signal profiles on a half of the first bit line and a half on the second bit line of the first bit line pair BLP1 are coupled into the adjacent first bit line of the second bit line pair, the opposite signal profiles meaning that the coupling-in signals are in opposite directions and reciprocally compensate one another. In this way, it is possible to reduce a coupling-in of a disturbing signal on account of signal profiles between the bit lines of different bit line pairs.

This is particularly advantageous, in contrast to the prior art, since a symmetrical signal profile can be achieved by means of the dynamic memory cell according to the invention.

Since the charge of the storage capacitor is applied only to one of the bit lines in the case of conventional memory cells, an asymmetrical signal profile results, so that complete compensation of the overcoupled signals is not achieved in the case of the arrangement shown in FIG. 2.

Figure 3:
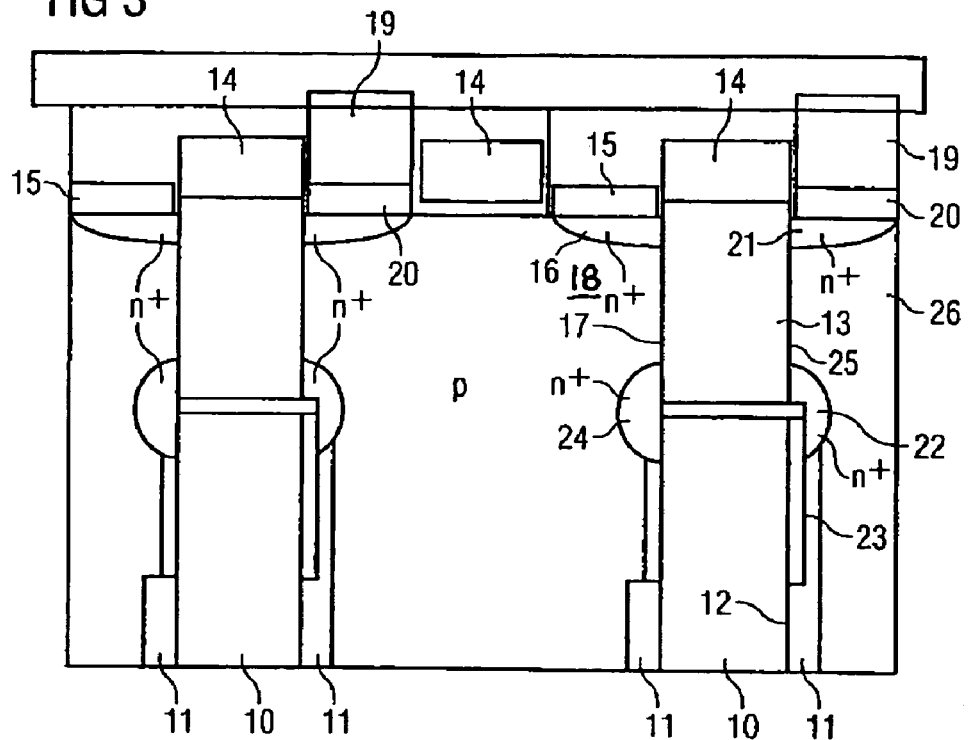
FIG. 3 shows a cross section through a substrate with an integrated dynamic memory cell according to the invention.

FIG. 3 illustrates a cross section through a semiconductor substrate with two integrated dynamic memory cells according to the invention. The storage capacitor C is embodied as a trench capacitor and formed by an inner region 10 and an outer region 11. The inner region 10 and the outer region 11 are isolated from one another by an insulation layer 12, thus producing a capacitor arrangement. Arranged above the trench capacitor is a word line stack 13, which is electrically connected to a word line 14. In the illustration shown, the word line 14 runs perpendicular to the sectional plane. The word line 14, the word line stack 13 and the trench capacitor 10, 11, 12 are preferably integrated vertically one above the other in the substrate.

A first selection transistor T1 is arranged vertically on a first side of the word line stack 13. A first conductive region 15, connected to the first bit line BL1, runs on the first side, i.e., adjacent to the word line 14. The first conductive region 15 is connected to a first drain/source region 16 of the first selection transistor T1. The first drain/source region 16 is preferably n+-doped and isolated from the word line stack 13 by a first insulation 17. A first channel region 18 of the first selection transistor T1 is arranged in the vertical direction below the first source/drain region 16. The insulation 17 between the first channel region 18 of the first selection transistor T1 and the word line stack 13 is designed as gate oxide 17.

A second source/drain region 24, electrically connected to the inner region 10 of the storage capacitor, is situated in the vertical direction below the first channel region 18. A first selection transistor T1 is formed in this way, which transistor can be driven via the word line 14 and can apply the charge in the inner region 10 of the storage capacitor to the first bit line BL1 depending on a selection signal on the word line 14.

A contact-connection region 19, connected to the second bit line BL2 (not shown), is provided on a second side of the word line stack 13. Via a second conductive region 20, the contact-connection region 19 can be connected to a third source/drain region 21 of the second selection transistor T2. The third source/drain region 21 is isolated from the word line stack 13 by a second insulation 25. A second channel region 26 of the second selection transistor T2 is situated in the vertical direction below the third source/drain region 21.

The second insulation 25, likewise designed as gate oxide, runs between the word line stack 13 and the second channel region 26 of the second selection transistor T2. A fourth source/drain region 22, likewise isolated from the word line stack 13 by the second insulation 25, is situated in the vertical direction below the second channel region 26.

The fourth source/drain region 22 is situated in the region of the trench capacitor, but an insulation region 23 is arranged between the inner region 10 of the trench capacitor and the fourth source/drain region 22. Instead, the fourth source/drain region 22 is electrically connected to the outer region 11 of the trench capacitor. In this way, the outer region 11 of the trench capacitor C is contact-connected via the second selection transistor T2. If the second selection transistor T2 is activated under the control of the selection signal on the word line 14, then the outer region 11 of the trench capacitor is connected to the second bit line BL2 via the contact region 19.

This produces a structure in which the selection transistors T1, T2 are arranged vertically, so that the area requirement is not expected to be enlarged in the realization of such a memory cell according to the invention.

Figure 4:
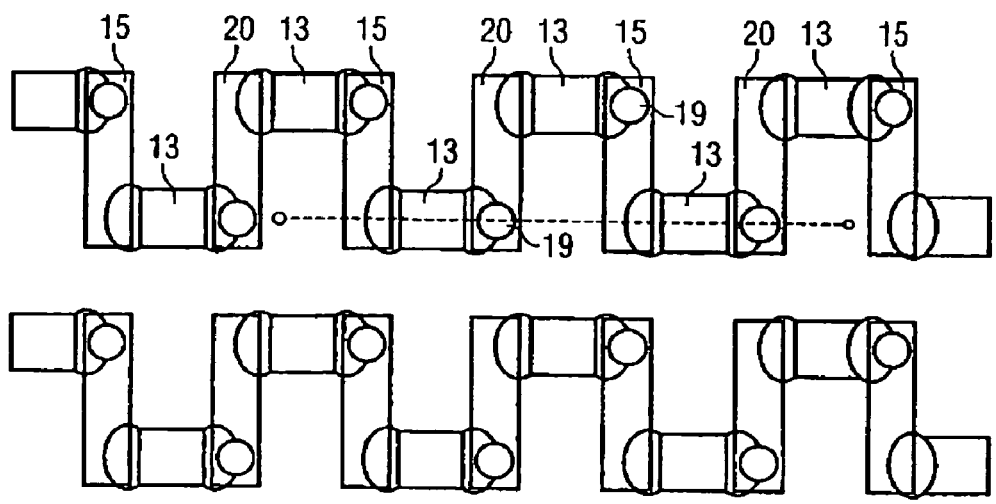
FIG. 4 shows a plan view of the substrate wafer with dynamic memory cells according to the invention.

FIG. 4 illustrates a plan view of a substrate with integrated dynamic memory cells according to the invention. For the sake of clarity, the vertically running word lines and the horizontally running bit lines are not shown. The memory cells are represented in the form of small square boxes with elliptical selection transistors T1, T2 connected on both sides. The sectional illustration of FIG. 3 corresponds to a section line depicted in dashed fashion in FIG. 4.

In order that the memory cells are in contact with both bit lines, the first and second conductive regions 15, 20 are provided, the first conductive regions 15 in each case being connected to a first selection transistor and the second conductive regions 20 in each case being connected to a second selection transistor T2.

The conductive regions 15, 20 are provided in a length such that, with the aid of contact connections, the first conductive region 15 can be connected to the first bit line BL1 and the second conductive region 20 can be connected to the second bit line BL2. The bit lines (not shown in FIG. 4) run horizontally over the structures illustrated in such a way that the first bit line runs over the contact connections 19 of the first conductive regions 15 and the second bit line runs over the contact connections 19 of the second conductive regions 20. The word lines 14 run at right angles with respect thereto, to be precise in each case over the memory cell structure, in order to make contact with the word line stack 13.

In this way, it is possible to produce an improved DRAM memory circuit which manages without an increased area requirement and, with the aid of two selection transistors T1, T2, simultaneously connects a storage capacitor C to two adjacent bit lines.

This has the advantage that the signal profiles on the adjacent bit lines of a bit line pair are symmetrical, so that, in the case of twisted bit lines, the crosstalk on the bit line which is not twisted with respect thereto leads to coupled-in signals which reciprocally compensate one another.

What is claimed is:

1. A dynamic memory cell, comprising:
    a storage capacitor;
    a first selection transistor; and
    a second selection transistor; wherein depending on a selection signal, a first electrode of the storage capacitor is connected to a first bit line via the first selection transistor and a second electrode of the storage capacitor is connected to a second bit line via the second selection transistor;
    wherein the first and second selection transistors are vertically disposed on opposite sides of the storage capacitor, respectively;
    wherein the storage capacitor comprises an inner region defining the first electrode, an outer region defining the second electrode and an insulation layer disposed between the regions to electrically isolate the regions from one another;
    wherein the first selection transistor is connected to the inner region and the second selection transistor is connected to the outer region; and
    wherein, when the selection transistors is activated, a charge of the inner region is applied to the first bit line and a charge of the outer region is applied to the second bit line.

2. The cell of claim 1, wherein the storage capacitor, the first selection transistor and the second selection transistor are disposed between the bit lines at a location where the bit lines are parallel to one another.

3. The cell of claim 1, wherein the storage capacitor, the first selection transistor and the second selection transistor are disposed on a substrate and wherein the first and second selection transistors are in a vertically stacked arrangement relative to the storage capacitor.

4. The cell of claim 1, wherein, in the event of the selection transistors being activated, a charge of the first electrode is applied to the first bit line and a charge of the second electrode is applied to the second bit line.

5. The cell of claim 1, wherein the first selection transistor comprises:
    a first source/drain region disposed at a surface of a substrate;
    a first channel region disposed below the first source/drain region; and
    a second source/drain region disposed below the channel region.

6. The cell of claim 5, wherein the first and second source/drain regions comprise $n^+$-doped regions of in the substrate.

7. The cell of claim 6, wherein the second selection transistor comprises:
    a third source/drain region disposed at the surface of the substrate;
    a second channel region disposed below the third source/drain region; and
    a fourth source/drain region disposed below the second channel region, wherein the third and fourth source/drain regions comprise $n^+$-doped regions of in the substrate.

8. The cell of claim 7, wherein the first source/drain region is electrically connected to the first bit line, wherein the second source/drain region is electrically connected to the first electrode of the storage capacitor, wherein the third source/drain region is electrically connected to the second bit line, and wherein the fourth source/drain region is electrically connected to the second electrode of the storage capacitor.

9. A DRAM circuit, comprising:
    a) a pair of bit lines comprising a first bit line and a second bit line;
    b) a plurality of dynamic memory cells coupled between the pair of bit lines, each dynamic memory cell comprising:
        a storage capacitor for storing a charge representative of a bit value;
        a first selection transistor coupled to a first electrode of the storage capacitor; and
        a second selection transistor coupled to a second electrode of the storage capacitor; wherein the first and second selection transistors are vertically disposed on opposite sides of the storage capacitor, respectively, and wherein, depending on a selection signal, the first electrode of the storage capacitor is connected to the first bit line via the first selection transistor and the second electrode of the storage capacitor is connected to the second bit line via the second selection transistor, wherein, when the selection transistors are activated, a charge of the first electrode is applied to the first bit line and a charge of the second electrode is applied to the second bit line; and c) a word line coupled to the selection transistors and configured to drive the selection transistors.

10. The DRAM circuit of claim 9, further comprising a sense amplifier coupled to the pair of bit lines.

11. The DRAM circuit of claim 9, wherein the storage capacitor, the first selection transistor and the second selection transistor of each dynamic memory cell are disposed between the bit lines at a location where the bit lines are parallel to one another.

12. The DRAM circuit of claim 9, wherein the bit lines cross over each other at least once along their respective lengths.

13. The DRAM circuit of claim 9, wherein the each selection transistor comprises:
   a first source/drain region disposed at a surface of a substrate;
   a channel region disposed below the first source/drain region; and
   a second source/drain region disposed below the channel region, wherein the third and fourth source/drain regions comprise $n^+$-doped regions of in the substrate.

14. The DRAM circuit of claim 9, further comprising: one or more pairs of bit lines; and
   a further plurality of dynamic memory cells coupled between each pair of bit lines, wherein, for each adjacent pairs of bit lines, one pair of bit lines includes bit lines that cross over each other between adjacent dynamic memory cells connected to the respective pair of bit lines.

15. A DRAM circuit disposed on a substrate, comprising:
a) a pair of bit lines comprising a first bit line and a second bit line;
b) a memory cell; comprising:
   a trench capacitor, comprising an inner region defining a first electrode, an outer region defining a second electrode and an insulation layer electrically isolating the inner and outer regions from one another;
   a first selection transistor coupled to the inner region of the trench capacitor; and
   a second selection transistor coupled to the outer region of the trench capacitor wherein the first and second selection transistors are vertically disposed on either side of the trench capacitor; wherein, in the event of the selection transistors being activated, a charge of the inner region is applied to the first bit line and a charge of the outer region is applied to the second bit line;

c) a conductive drive region disposed between the selection transistors and to which a drive signal is applied for activation of the selection transistors;

d) an insulator disposed on the drive region; and e) a word line coupled to the drive region and configured to allow selection of the selection transistors.

16. The DRAM circuit of claim 15, wherein the drive region is disposed over the trench capacitor.

17. The DRAM circuit of claim 15, further comprising a sense amplifier coupled to the pair of bit lines.

18. The DRAM circuit of claim 15, wherein the drive region is configured to serve as a gate region for the first and the second selection transistors.

19. The DRAM circuit of claim 15, wherein a first drain/source region of the first selection transistor contacts the inner region of the trench capacitor and a second drain/source region of the second selection transistor contacts the outer region of the trench capacitor.

20. The DRAM circuit of claim 19, wherein the drive region is configured to serve as a gate region for the first and the second selection transistors.

* * * * *